United States Patent [19]
Bearinger et al.

[11] Patent Number: 6,144,106
[45] Date of Patent: Nov. 7, 2000

[54] ELECTRONIC COATINGS

[75] Inventors: Clayton R. Bearinger; Robert Charles Camilletti; Loren Andrew Haluska; Keith Winton Michael, all of Midland, Mich.

[73] Assignee: Dow Corning Corporation, Midland, Mich.

[21] Appl. No.: 08/939,241

[22] Filed: Sep. 29, 1997

Related U.S. Application Data

[62] Division of application No. 08/725,787, Oct. 4, 1996, Pat. No. 5,711,987.

[51] Int. Cl.$^7$ .................................................. H01L 23/29
[52] U.S. Cl. ........................... 257/789; 257/790; 257/922
[58] Field of Search ..................... 257/789, 790, 257/703, 705, 922; 428/447

[56] References Cited

U.S. PATENT DOCUMENTS

| | | | |
|---|---|---|---|
| 3,615,272 | 10/1971 | Collins | 23/366 |
| 4,027,073 | 5/1977 | Clark | 428/412 |
| 4,340,619 | 7/1982 | Gaul, Jr. | 427/288 |
| 4,540,763 | 9/1985 | Kirchhoff | 526/281 |
| 4,540,803 | 9/1985 | Cannady | 556/412 |
| 4,642,329 | 2/1987 | Kirchhoff et al. | 526/284 |
| 4,730,030 | 3/1988 | Hahn et al. | 526/262 |
| 4,753,855 | 6/1988 | Haluska et al. | 428/702 |
| 4,783,541 | 11/1988 | Eichler et al. | 549/83 |
| 4,812,588 | 3/1989 | Schrock | 556/453 |
| 4,826,997 | 5/1989 | Kirchhoff | 548/546 |
| 4,910,173 | 3/1990 | Niebylski | 501/97 |
| 4,973,526 | 11/1990 | Haluska | 428/697 |
| 4,973,636 | 11/1990 | Corley | 526/262 |
| 4,999,397 | 3/1991 | Weiss et al. | 524/755 |
| 4,999,449 | 3/1991 | Kirchhoff | 560/8 |
| 5,010,159 | 4/1991 | Bank et al. | 528/23 |
| 5,011,706 | 4/1991 | Tarhay et al. | 427/39 |
| 5,025,080 | 6/1991 | Wong | 528/170 |
| 5,063,267 | 11/1991 | Hanneman et al. | 524/284 |
| 5,258,334 | 11/1993 | Lantz, II | 437/238 |
| 5,387,480 | 2/1995 | Haluska et al. | 428/698 |
| 5,399,441 | 3/1995 | Bearinger et al. | 428/689 |
| 5,416,190 | 5/1995 | Mine et al. | 528/492 |
| 5,436,083 | 7/1995 | Haluska et al. | 428/688 |
| 5,436,084 | 7/1995 | Haluska et al. | 428/688 |
| 5,458,912 | 10/1995 | Camilletti et al. | 427/126.4 |
| 5,492,958 | 2/1996 | Haluska et al. | 524/439 |

FOREIGN PATENT DOCUMENTS

| | | | |
|---|---|---|---|
| 0615000A1 | 2/1994 | European Pat. Off. | |
| 59-178749 | 3/1983 | Japan. | |
| 60-86017 | 5/1985 | Japan. | |
| 63-107122 | 5/1988 | Japan. | |
| 1-44052 | 2/1989 | Japan | 257/790 |
| 3-171653 | 7/1991 | Japan | 257/790 |

*Primary Examiner*—John Guay
*Attorney, Agent, or Firm*—Sharon K. Severance; Rick D. Streu

[57] ABSTRACT

The instant invention pertains to a multi-layer tamper proof electronic coating wherein the first layer is a protecting layer produced from a preceramic silicon containing material and at least one filler. The second layer is a resin sealer coat produced from a sealer resin selected from the group consisting of colloidal inorganic-based siloxane resins, benzocyclobutene based resins, polyimide polymers, siloxane polyimides and parylenes. An optional third layer is a cap coating layer selected from $SiO_2$ coating, $SiO_2$/ceramic oxide coating, silicon containing coatings, silicon carbon containing coatings, silicon nitrogen containing coatings, silicon oxygen nitrogen coatings, silicon nitrogen carbon containing coatings and/or diamond like coatings. An optional fourth layer is a resin overcoat produced from an overcoat resin selected from the group consisting of colloidal inorganic-based siloxane resins, benzocyclobutene based resins, polyimide polymers, siloxane polyimides, parylenes, photoresist polymers, siloxane room temperature vulcanizable compositions, or other organic polymer. The use of the multi-layer coating on the electronic device results in an electronic device that is resistant to analytical techniques such as ozone, UV-ozone, gaseous free radicals and ions, vapor or liquid borne reactive species, plasma, abrasion, radiation, light, wet etching and others; moisture; chemicals and other environmental contaminants; shock and erosion, delamination and/or separation.

17 Claims, No Drawings

ELECTRONIC COATINGS

This application is a division of application Ser. No. 08/725,787 filed Oct. 4, 1996 which application is now U.S Pat. No. 5,711,987 of which the following is the specification.

BACKGROUND OF THE INVENTION

The instant invention pertains to a multi-layer tamper proof electronic coating. The multi-layer coating is applied to the device chip at the wafer fabrication stage.

The dissection of electronic devices is a major source of information for both commercial competitors as well as foreign governments. The devices may be analyzed by numerous techniques such as x-rays, cross-sectioning, etching and others. Because of the ability to analyze the devices it has become desirable to make the electronic devices resistant to the numerous analytical techniques.

The use of certain fillers to improve the tamper-proof characteristics of electronic coatings is known in the art. For example, U.S. Pat. No. 5,258,334 to Lantz, II, U.S. Pat. No. 5,399,441 to Bearinger et al., U.S. Pat. No. 5,387,480 to Haluska et al., U.S. Pat. No. 5,436,083 to Haluska et al., U.S. Pat. No. 5,436,084 to Haluska et al., U.S. Pat. No. 5,458,912 to Camilletti et al.; U.S. Pat. No. 5,492,958 to Haluska et al. and EP 0615000 all disclose coating compositions comprising a filler and a preceramic silicon containing material, borosilazane or polysilazane. The fillers disclosed in the above patents impart a variety of properties to the coating such as opaqueness, radiopaqueness, or resistance to plasma etching, wet etching or cross-sectioning. In addition to the filled electronic coating there may be other coatings applied to the electronic substrate to provide protection from the environment or make the devices further resistant to the analytical techniques.

The coatings taught in the above patents are not resistant to erosion, delamination and/or separation and thus the coatings could be removed from the device. Thus, it is desirable to produce a multi-layer coating for electronic devices that is resistant to analytical techniques, erosion, delamination and/or separation and optionally the environment.

It is therefore an object of the instant invention to provide a multi-layer tamper-proof electronic coating comprising a first protecting layer, a second sealer layer, an optional third capping layer and an optional fourth overcoat layer.

SUMMARY OF THE INVENTION

The instant invention pertains to a multi-layer tamper proof electronic coating. The coating may comprise two or more layers. The first layer is a protecting layer produced from a preceramic silicon containing material containing at least one filler. The first layer provides protection to the device from various analytical techniques. The second layer is a resin sealer coat produced from a sealer resin selected from the group consisting of colloidal inorganic-based siloxane resins, benzocyclobutene based resins, polyimide polymers, siloxane polyimides and parylenes. The second layer seals the first layer, provides water repellancy, results in smooth surface and provides resistance to erosion, delamination and/or separation. An optional third layer is a cap coating layer selected from $SiO_2$ coating, $SiO_2$/ceramic oxide coating, silicon containing coatings, silicon carbon containing coatings, silicon nitrogen containing coatings, silicon oxygen nitrogen coatings, silicon nitrogen carbon containing coatings and/or diamond like coatings produced from deposition (i.e. CVD, PECVD, etc.) of amorphous SiC:H, diamond, silicon nitride and parylene. The third layer provides hermetic protection for the device, makes the device resistant to wet etching and further increases the resistance to erosion, delamination and/or separation. An optional fourth layer is a resin overcoat produced from an overcoat resin selected from the group consisting of colloidal inorganic-based siloxane resins, benzocyclobutene based resins, polyimide polymers, siloxane polyimides, parylenes, photoresist polymers, siloxane room temperature vulcanizable compositions, or other organic polymers. The fourth layer provides additional protection from erosion, delamination and/or separation. The use of the multi-layer coating on the electronic device results in an electronic device that is resistant to analytical techniques such as ozone, UV-ozone, gaseous free radicals and ions, vapor or liquid borne reactive species, plasma, abrasion, radiation, light, wet etching and others; moisture; chemicals and other environmental contaminants; shock and erosion, delamination and/or separation.

THE INVENTION

The instant invention pertains to a multi-layer coating for electronic devices. The multi-layer coating contains at least two layers, preferably 3 layers. By electronic device it is meant to include silicon based devices, gallium arsenide based devices, focal plane arrays, opto-electronic devices, photovoltaic cells and optical devices.

The first layer is a protecting layer produced from a preceramic silicon containing material and at least one filler. The first layer is produced by applying a coating composition comprising a preceramic silicon-containing material and at least one filler onto the surface of an electronic device and then heating the coated device to a temperature sufficient to convert the composition to a silica-containing ceramic matrix having the filler distributed therein. The first protecting layer has a thickness of from 0.5 to 500 micrometers, preferably from 1 to 100 micrometers.

Compositions comprising a preceramic silicon containing material and at least one filler for use on electronic devices known in the art which provide protection to an electronic device are useful herein. U.S. Pat. No. 5,399,441 to Bearinger et al., hereby incorporated by reference discloses compositions comprising a preceramic silicon containing material and a filler comprising an insoluble salt of a heavy metal or an optically opaque filler. U.S. Pat. No. 5,387,480 to Haluska et al., hereby incorporated by reference, discloses a preceramic silicon containing material and a filler having a dielectric constant of at least 8. U.S. Pat. No. 5,458,912 to Camilletti, hereby incorporated by reference, discloses a preceramic silicon containing material and a filler wherein the filler is one which reacts in an oxidizing atmosphere to liberate enough heat to damage the electronic device. U.S. Pat. No. 5,492,958 to Haluska et al. discloses a hydrogen silsesquioxane resin and a metallic filler wherein the metallic filler renders the coating magnetic, thermally or electrically conductive.

Specifically, the first layer is produced from a mixture comprising a preceramic silicon containing material and a filler. The preferred preceramic silicon-containing materials to be used in the process of this invention are precursors to silicon oxides, especially silica The silicon oxide precursors which may be used in the invention include, but are not limited to, hydrogen silsesquioxane resin (H-resin); hydrolyzed or partially hydrolyzed products of compounds or mixtures of compounds having the formula $R^1{}_nSi(OR^1)_{4-n}$;

or combinations of the above; in which each $R^1$ is independently an aliphatic, alicyclic or aromatic substituent of 1–20 carbon atoms, preferably 1–4, such as an alkyl (eg. methyl, ethyl, propyl), alkenyl (eg. vinyl or allyl), alkynyl (eg. ethynyl), cyclopentyl, cyclohexyl, phenyl etc., and n is 0–3, preferably 0 or 1.

The H-resin which may be used in this invention includes hydridosiloxane resins of the formula $HSi(OH)_x(OR)_yO_{z/2}$, in which each R is independently an organic group or a substituted organic group which, when bonded to silicon through the oxygen atom, forms a hydrolyzable substituent, $x=0–2$, $y=0–2$, $z=1–3$, $x+y+z=3$. Examples of R include alkyls such as methyl, ethyl, propyl, butyl, etc., aryls such as phenyl, and alkenyls such as allyl or vinyl. These resins may be fully condensed $(HSiO_{3/2})_n$ or they may be only partially hydrolyzed (i.e., containing some Si—OR) and/or partially condensed (i.e., containing some Si—OH). Although not represented by this structure, these resins may also contain a small number (eg., less than about 10%) of silicon atoms which have either 0 or 2 hydrogen atoms attached thereto or a small number of SiC bonds due to various factors involved in their formation or handling.

The above H-resins and methods for their production are known in the art. For example, Collins et al. in U.S. Pat. No. 3,615,272, which is incorporated herein by reference, teach the production of a nearly fully condensed H-resin (which may contain up to 100–300 ppm silanol) by a process comprising hydrolyzing trichlorosilane in a benzenesulfonic acid hydrate hydrolysis medium and then washing the resultant resin with water or aqueous sulfuric acid. Similarly, Bank et al. in U.S. Pat. No. 5,010,159, which is hereby incorporated by reference, teach an alternative method comprising hydrolyzing hydridosilanes in an arylsulfonic acid hydrate hydrolysis medium to form a resin which is then contacted with a neutralizing agent.

Other hydridosiloxane resins, such as those described by Frye et al. in U.S. Pat. No. 4,999,397, hereby incorporated by reference, those produced by hydrolyzing an alkoxy or acyloxy silane in an acidic, alcoholic hydrolysis medium, those described in Kokai Patent Nos. 59-178749, 60-86017 and 63-107122, or any other equivalent hydridosiloxane, will also function herein.

It is to be noted that in a preferred embodiment of the invention, specific molecular weight fractions of the above H-resins may also be used in this process. Such fractions and methods for their preparation are taught by Hanneman et al. in U.S. Pat. Nos. 5,063,267 and 5,416,190 which are hereby incorporated by reference. A preferred fraction comprises material wherein at least 75% of the polymeric species have a molecular weight above about 1200 and a more preferred fraction comprises material wherein at least 75% of the polymeric species have a number average molecular weight between about 1200 and about 100,000.

The hydrogen silsesquioxane resin coating material may contain a platinum, rhodium or copper catalyst to increase the rate and extent of conversion to silica. Generally, any platinum, rhodium or copper compound or complex which can be solubilized will be functional. For instance, a composition such as platinum acetylacetonate, rhodium catalyst $RhCl_3[S(CH_2CH_2CH_2CH_3)_2]_3$, obtained from Dow Corning Corporation, Midland, Mich., or cupric naphthenate are all within the scope of this invention. These catalysts are generally added in an amount of between about 5 to 1000 ppm platinum, rhodium or copper based on the weight of hydrogen silsesquioxane resin.

The hydrogen silsesquioxane resin coating material may also contain an organic or inorganic peroxide to increase the rate and extent of conversion to silica. Organic and inorganic peroxides useful in the instant invention may be exemplified by, but not limited to barium peroxide, strontium peroxide, calcium peroxide and others.

The second type of preceramic silicon containing material useful herein includes hydrolyzed or partially hydrolyzed products of compounds or mixtures of compounds of the formula $R^1{}_nSi(OR^1)_{4-n}$ in which $R^1$ and n are as defined above. Some of these materials are commercially available, for example, under the tradename ACCUGLASS (Allied Signal). Specific compounds of this type include methyltriethoxysilane, phenyltriethoxysilane, diethyldiethoxysilane, methyltrimethoxysilane, dimethyldimethoxysilane, phenyltrimethoxysilane, vinyltrimethoxysilane, tetramethoxysilane, tetraethoxysilane, tetrapropoxysilane, and tetrabutoxysilane. After hydrolysis or partial hydrolysis of these compounds, the silicon atoms therein may be bonded to C, OH or $OR^1$ groups, but a substantial portion of the material is believed to be condensed in the form of soluble Si—O—Si resins. Compounds in which x=2 or 3 are generally not used alone as volatile cyclic structures are generated during pyrolysis, but small amounts of said compounds may be cohydrolyzed with other silanes to prepare useful preceramic materials.

The hydrolyzed or partially hydrolyzed products may contain a dispersion of colloidal silica ($SiO_2$). Typically the hydrolyzed or partially hydrolyzed products contain from 10 to 50 weight percent solids in an alcohol-water medium consisting essentially of 10 to 70 weight percent colloidal silica and 30 to 90 weight percent of the hydrolyzate or partial hydrolyzate. The compositions contain sufficient acid to provide a pH in the range of 3.0 to 6.0. These mixtures of colloidal silica and hydrolyzate are commercially available as Silvue® 101 from SDC Coatings, Inc., Anaheim, Calif.

In addition to the above silicon-oxide precursors, other ceramic oxide precursors may also be used in combination with the above silicon oxide precursors. The ceramic oxide precursors specifically contemplated herein include compounds of various metals such as aluminum, titanium, zirconium, tantalum, niobium and/or vanadium as well as various non-metallic compounds such as those of boron or phosphorous which may be dissolved in solution, hydrolyzed, and subsequently pyrolyzed at relatively low temperatures to form ceramic oxides. The use of the ceramic oxide precursors is described in U.S. Pat. Nos. 4,753,855 and 4,973,526, herein incorporated by reference.

The above ceramic oxide precursor compounds generally have one or more hydrolyzable groups bonded to the above metal or non-metal, depending on the valence of the metal. The number of hydrolyzable groups to be included in these compounds is not critical as long as the compound is soluble in the solvent. Likewise, selection of the exact hydrolyzable substituent is not critical since the substituents are either hydrolyzed or pyrolyzed out of the system. Typical hydrolyzable groups include, but are not limited to, alkoxy, such as methoxy, propoxy, butoxy and hexoxy, acyloxy, such as acetoxy, other organic groups bonded to said metal or non-metal through an oxygen such as acetylacetonate or an amino groups. Specific compounds, therefore, include zirconium tetracetylacetonate, titanium dibutoxy diacetylacetonate, aluminum triacetylacetonate, tetraisobutoxy titanium and $Ti(N(CH_3)_2)_4$.

When a silicon oxide such as $SiO_2$ is to be combined with one of the above ceramic oxide precursors, generally it is used in an amount such that the final ceramic contains 70 to 99.9 percent by weight silicon oxide.

Examples of other silicon-containing preceramic materials include silicon carbonitide precursors such as hydridopolysilazane (HPZ) resin, methylpolydisilylazane (MPDZ) resin and polyborosilazane resin (BHPZ). Processes for the production of these materials are described in U.S. Pat. Nos. 4,540,803; 4,340,619 and 4,910,173, respectively, all of which are incorporated herein by reference. Examples of silicon carbide precursors include polycarbosilanes and examples of silicon nitride precursors include polysilazanes. Oxygen can be incorporated into the ceramics resulting from the above precursors or the precursors can be converted to silica by pyrolyzing them in an oxygen-containing environment. Mixtures of silicon-containing preceramic materials may also be used.

The fillers used herein are those known in the art for use in coatings with polymers. By the term "filler" it is meant a finely divided solid phase which is distributed within the resin and the final ceramic coating. Specific fillers useful in the instant invention include, but are not limited to, optically opaque fillers, radiopaque fillers, luminescent fillers, oxidation resistant fillers, abrasion resistant fillers, magnetic fillers and conductive fillers. The filler may include various inorganic and organic fillers, especially inorganic fillers, in a variety of morphologies including, but not limited to powders, particles, flakes, microballoons, and the like. There may one or more types of fillers present in the preceramic silicon-containing material coating composition.

Optically opaque fillers are fillers that when mixed with the preceramic silicon containing material render the resultant coating impenetrable to visual light. Optically opaque fillers include, but are not limited to, oxides, nitrides and carbides of silicon and alumina, metals and inorganic pigments. Preferred optically opaque fillers are plasma alumina microballoons having an average size of about 6 microns, silica microballoons having an average size of about 5 to 40 microns, silicon nitride ($Si_3N_4$) powder or whiskers; silicon carbide (SiC) powder or whiskers, aluminum nitride (AlN) powder and black inorganic pigments such as black Ferro® F6331 having an average size of about 0.4 microns.

Radiopaque fillers are fillers that when mixed with the preceramic silicon containing material render the resultant coating impenetrable to radiation such as x-rays, UV, IR, and visible light as well as sound waves. Radiopaque fillers include, but are not limited to, heavy metals such as tungsten and lead and insoluble salts of heavy metals such as barium, lead, silver, gold, cadmium, antimony, tin, palladium, strontium, tungsten and bismuth. The salts can include, for example, carbonates, sulfates and oxides. Preferred radiopaque filler is tungsten carbide.

Luminescent fillers are fillers that when mixed with the preceramic silicon containing material result in a coating that will absorb energy and emit electromagnetic radiation in excess of thermal radiation. The fillers are typically phosphors such as sulfides such as zinc sulfide and cadmium sulfide; selenides; sulfoselenides; oxysulfides, oxygen dominate phosphors such as borates, aluminates, gallates, silicates and the like; and halide phosphors such as alkali metal halides, alkaline earth halides and oxyhalides. Preferred are sulfides and most preferred is zinc sulfide. The phosphor compounds may also be doped with an activator. Activators include, but are not limited to, manganese, silver and copper; rare earth ions which may be in the form of halides. The activator is generally present in amounts of about 0.1 to 10 mol % based on the phosphor.

Oxidation resistant fillers are fillers that when mixed with the preceramic silicon containing material render the resultant coating resistant to further oxidation by thermal radiation. More specifically, oxidation resistant fillers are fillers that react in an oxidizing environment to liberate excessive, localized heat to the underlying substrate and thus inhibits further examination of the electronic device. Oxidation resistant fillers may be exemplified by, but not limited to, metals such as magnesium, iron, silicon, tin, aluminum and zinc; oxides such as phosphorous pentoxide and others. The preferred oxidation resistant filler is phosphorous pentoxide.

Abrasion resistant fillers are fillers that when mixed with the preceramic silicon containing material render the resultant coating difficult to remove by a frictional means such as scraping or polishing without damaging the underlying substrate. Abrasion resistant fillers may be exemplified by, but not limited to diamond, titanium nitride (TiN), tungsten carbide, tantalum carbide, and fibers of graphite, kevlar, nextel, soffill, Aluminum oxide ($Al_2O_3$), Fiber FP and others.

Energy resistant fillers are fillers that when mixed with the preceramic silicon containing material render the resultant coating impenetrable and/or reactive to energy sources such as ozone, UV-ozone, gaseous free radicals and ions, any vapor or liquid borne reactive species and plasmas which could cause damage to the underlying substrate. Energy resistant fillers may be exemplified by, but not limited to heavy metals such as lead, tungsten and others.

Magnetic fillers are fillers that when mixed with the preceramic silicon containing material render the resultant coating magnetic (i.e. magnetized by a magnetic field; having net magnetic moment). Magnetic fillers may be exemplified by carbon alloys ferrites, iron carbonyl, and alloys of metals such as iron manganese, cobalt, nickel, copper, titanium, tungsten, vanadium, molybdenum, magnesium, aluminum, chromium, zirconium, lead, silicon and zinc such as $Fe_2O_3$, MnZn, NiZn, CuZn and other ferrite materials.

Conductive fillers are fillers that when mixed with the preceramic silicon containing material render the resultant coating either electrically or thermally conductive. Conductive fillers may be exemplified by gold, silver copper, aluminum, nickel, zinc chromium, cobalt, and others.

Other fillers useful herein include synthetic and natural materials such as oxides, nitrides, borides and carbide of various metals and non-metals such as glass, alumina, silica, titanium dioxide, zinc oxide, tungsten oxide and ruthenium oxide; titanates such as potassium titanate and barium titanate; niobates such as lithium niobate and lead niobate; barium sulfate; calcium carbonate; precipitated diatomite; aluminum silicate or other silicates; pigments; phosphors; metals such as silver, aluminum, or copper; wollastonite; mica; kaolin; clay and talc; inorganic materials such as cellulose, polyamides and phenol resins; high dielectric constant fillers such as titanate, niobate or tungstate salts of metals such as strontium, zirconium, barium, lead, lanthanium, iron, zinc and magnesium such as barium titanate, potassium titanate, lead niobate, lithium titanate, strontium titanate, barium strontium, lead lanthanium zirconium titanate, lead zirconium titanate, and lead tungstate.

The particle size and shape of the above fillers can vary over a wide range (i.e., submicron to 1 mil) depending on factors such as the type of filler, the desired coating thickness and others. There may be only one filler present or a combination of fillers present depending on the protection desired. It is preferred to have a combination of fillers present to provide a wide range of protection from various analytical techniques. The preferred filler is a mixture of tungsten carbide (WC), tungsten metal (W), diamond dust and phosphorous pentoxide (P205).

The amount of filler used can be varied over a wide range depending on, for example, the quality and electrical characteristics desired in the final coating. Generally the fillers are used in an amount less than about 90 weight percent of the coating to insure that there is enough resin present to bind the filler. It is preferred that the filler is present in the range of about 1 to 91 volume %, more preferred 5 to 80 volume %.

If desired other materials may also be present in the coating composition. For example, adhesion promoters, suspending agents and other optional components may be added. The adhesion promoters may be exemplified by, but not limited to silanes glycidoxypropyltrimethoxysilane, mercaptopropyltrimethoxysilane, vinyl triacetoxysilane and others.

The first protection layer is formed by combining together the preceramic silicon containing material, at least one filler and any optional components and applying the mixture to the surface of the electronic device. The electronic device can be bare (i.e. no passivation) or the device can have a primary passivation. Such primary passivation can, be ceramic coatings such as silica, silicon nitride, silicon carbide, silicon oxynitride, silicon oxycarbide PSG, BPSG and others deposited by CVD, PVD, PECVD or sol—gel approaches. Primary passivation and methods of depositing are known to those skilled in the art.

The preceramic silicon containing material and filler may be applied in any manner, but a preferred method involves producing a solvent dispersion of the preceramic silicon containing material, filler and any optional components and applying the solvent dispersion to the surface of the substrate. Various facilitating means such as stirring and/or heating may be used to dissolve or disperse the preceramic silicon containing material and filler and create a more uniform application material. Solvents which may be used include any agent or mixture of agents which will dissolve the preceramic silicon containing material and disperse the filler. These solvents can include alcohols such as ethyl alcohol or isopropyl alcohol; aromatic hydrocarbons such as benzene or toluene; alkanes such as n-heptane, dodecane or nonane; ketones; esters; glycol ethers; or cyclic dimethylpolysiloxanes. The solvent is present in an amount sufficient to dissolve/disperse the above materials to the concentration desired for application. Typically the coating composition contains from 20 to 99.1 wt % solvent, preferable from 50 to 99 wt % solvent.

Specific methods for application of the solvent dispersion include, but are not limited to spin coating, dip coating, spray coating, flow coating, screen printing or others. The solvent is then allowed to evaporate from the coated substrate resulting in the deposition of the preceramic silicon containing material and filler. Any suitable means for evaporation may be used such as simple air drying by exposure to an ambient environment, by the application of a vacuum, or mild heat (<50°) or during the early stages of the curing process. It should be noted that when spin coating is used, the additional drying method is minimized as the spinning drives off the solvent.

The preceramic silicon containing material and filler are then cured by heating to a sufficient temperature to form a silica-containing ceramic matrix having a filler distributed therein. By silica-containing ceramic matrix it is meant a hard coating obtained after heating the preceramic silicon-containing material wherein the coating contains both amorphous silica ($SiO_2$) materials as well as amorphous silica-like materials that are not fully free of residual carbon, silanol (Si—OH) and/or hydrogen. Generally, the temperature is in the range of 50° C. to 1000° C. depending on the pyrolysis atmosphere. Preferred temperatures are in the range of 50° C. to 800° C., more preferred are in the range of 50° C. to 450° C. Heating is generally conducted for a time sufficient to ceramify, generally up to 6 hours with less than 3 hours being preferred. The heating may take place at any effective atmospheric pressure from vacuum to super-atmospheric and under any effective oxidizing or non-oxidizing gaseous environment such as an inert gas such as $N_2$, Ar, He and others, air, $O_2$, ammonia, amines, moisture, $N_2O$ and others. Any method of heating such as the use of a convection oven, rapid thermal processing, hot plate, or radiant of microwave energy may be used herein. The rate of heating is also not critical but is most practical and preferred to heat as rapidly as possible.

The second layer is a resin sealer coat produced from a sealer resin selected from the group consisting of colloidal inorganic-based siloxane resins, benzocyclobutene based resins, polyimides, siloxane polyimides and parylenes. Preferably the second layer is produced from a colloidal inorganic-based siloxane resin. The second layer is produced by applying the sealer resin onto the electronic device over the first layer and then heating the coated device to a temperature sufficient to cure the resin. The second sealing layer has a thickness of from 0.1 to 8 micrometers, preferably from 1 to 3 micrometers.

Colloidal inorganic-based siloxane resins useful in the instant invention are resins that comprise an acidic dispersion of colloidal silica and hydroxylated silsesquioxane in an alcohol-water medium. A detailed description and method of preparation for the colloidal inorganic-based siloxane resin may be found in U.S. Pat. No. 4,027,073, which is hereby incorporated by reference. More specifically, the colloidal inorganic-based siloxane resins comprise a dispersion of colloidal silica ($SiO_2$) in lower aliphatic alcohol-water solution of the partial condensate of a silanol of the formula $R^2Si(OH)_3$ where $R^2$ is selected from the group consisting alkyl radicals having 1 to 3 carbon atoms, the vinyl radical, the 3,3,3-trifluoropropyl radical, the gamma-glycidoxypropyl radical and the gamma-methacryloxyropyl radical. At least 70 weight percent of the silanol is $CH_3Si(OH)_3$. The colloidal inorganic-based siloxane resins compositions contain from 10 to 50 weight percent solids consisting essentially of 10 to 70 weight percent colloidal silica and 30 to 90 weight percent of the partial condensate of a silanol. Finally the colloidal inorganic-based siloxane resin compositions contain sufficient acid to provide a pH in the range of 3.0 to 6.0. Colloidal inorganic-based siloxane resins are commercially available as Silvue® 101 from SDC Coatings, Inc., Anaheim, Calif.

Benzocyclobutene based resins are known in the art and are commercially available. Benzocyclobutene based resins useful herein are generally described in U.S. Pat. Nos. 4,540,763; 4,642,329; 4,730,030; 4,783,514; 4,812,588; 4,826,997; 4,973,636; 4,999,449; 5,025,080. Preferably, the benzocyclobutene based resins useful herein are resins derived from monomers of the general formula

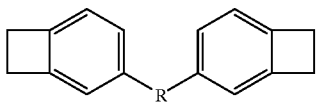

where R is preferably —C≡C—Si(CH$_3$)$_2$—O—Si(CH$_3$)$_2$—C≡C—. One such resin is available from Dow Chemical Co., Midland, Mich. as Cyclotene® 3022. Cyclotene® 3022 is a divinyl siloxane bis-benzocyclobutene based resin.

Polyimides and siloxane polyimides useful herein are also known in the art. Polyimides in general contain the structure

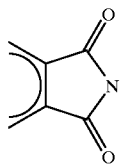

Polyimides that have particular usefulness for electronic coatings are commercially available and known in the art. For example, the polyimides may be purchased from Ciba-Geigy Corporation under the tradename Probimide™.

Parylenes are known in the art and are specifically represented by polymers of general formulae Parylene N:

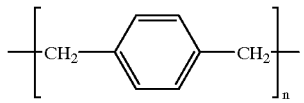

Parylene C:

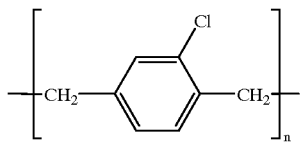

Parylene D:

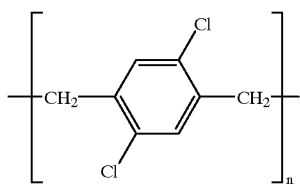

Parylene AF—4

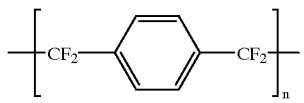

The resin sealer coat second layer may be applied to the electronic device by any method known in the art. Conventional methods include flowing, spinning, spraying, dipping, PVD or CVD to form a continuous surface film. The resin second layer may be applied to the electronic device from a solvent. The second layer coating is cured by heating to a temperature of from 60° C. to 400° C., preferably heating from 350 to 400° C. Any of the above described methods for heating the first layer coating are useful herein for curing the resin. Any atmosphere suitable for curing the resins maybe used herein. For example, the resins may be cured in air or an inert atmosphere such as nitrogen. Optionally, the first and second layers may be cured during the same cure cycle or in situ processing.

An optional third layer is a cap coating layer selected from SiO$_2$ coatings, SiO$_2$/ceramic oxide coatings, silicon containing coatings, silicon carbon containing coatings, silicon nitrogen containing coatings, silicon oxygen nitrogen coatings, silicon nitrogen carbon containing coatings and/or diamond like coatings produced from deposition (i.e. CVD, PECVD, etc.) of amorphous SiC:H, diamond, silicon nitride or parylene. The third capping layer has a thickness of from 0.1 to 100 micrometers, preferably from 0.5 to 10 micrometers.

Methods for the application and formation of such coatings are described in U.S. Pat. No. 4,756,977 and U.S. Pat. No. 5,011,706, both hereby incorporated by reference. The preferred cap coating layer is a coating produced by plasma enhanced chemical vapor deposition (PECVD) of amorphous SiC:H, diamond or silicon nitride. U.S. patent application Ser. No. 08/550,260 to Loboda, commonly assigned, hereby incorporated by reference, describes PECVD of an amorphous coating containing silicon, carbon and nitrogen onto a substrate. The method comprises depositing an organosilane which is in a gaseous state at a temperature less than about 500° C. and a source of nitrogen in a gaseous state at a temperature less than about 500° C. The organosilane is preferably trimethylsilane and the nitrogen source is preferably ammonia U.S. patent application Ser. No. 08/550,261 to Loboda, commonly assigned, hereby incorporated by reference, describes PECVD of coating containing silicon and oxygen onto a substrate. The method comprises depositing an organosilane which is in a gaseous state at a temperature less than about 500° C. and a source of oxygen in a gaseous state at a temperature less than about 500° C. The organosilane is preferably trimethylsilane and the oxygen source is preferably nitrous oxide.

An optional fourth layer is a resin overcoat produced from a coating material selected from the group consisting of colloidal inorganic-based siloxane resins, benzocyclobutene based resin resins, polyimides, siloxane polyimides, parylene, photoresist polymers, siloxane room temperature vulcanizable compositions, or other organic polymers. The fourth layer provides additional protection from erosion, delamination and/or separation. The colloidal inorganic-based siloxane resin, benzocyclobutene based resins, polyimides, siloxane polyimides, and parylenes useful herein are the same as those described above for the second layer. In addition to those materials described for the second layer the fourth layer may be other known coating materials such as photoresist polymers (i.e. photoresist polyimides), siloxane room temperature vulcanizable compositions, or other organic polymers (i.e. styrene-butadiene polymer, epoxy, etc.).

The fourth overcoat layer has a thickness of from 0.1 to 100 micrometers, preferably from 0.5 to 10 micrometers. The fourth overcoat layer may be applied to the electronic device by any method known in the art. Conventional methods include flowing, spinning, spraying, or dipping to form a continuous surface film. The fourth overcoat layer may be applied from a solvent. The fourth overcoat layer is cured by heating to a temperature of from 60° C. to 400° C., preferably heating from 350 to 400 ° C. Any of the above described methods for heating the first layer coating are useful herein.

The use of the multi-layer coating on the electronic device results in an electronic device that is resistant to analytical techniques such as ozone, UV-ozone, gaseous free radicals and ions, vapor or liquid borne reactive species, plasma, abrasion, radiation, light, wet etching and others; moisture; chemicals and other environmental contaminants; shock and erosion, delamination and/or separation.

The tamperproof devices of the instant invention are fabricated by applying the first protecting layer to the device and thereafter curing the layer, applying the second sealer layer over the first protecting layer and thereafter curing the second layer; optionally applying the third capping layer over the second sealer layer and curing the third layer; and optionally applying the fourth overcoat layer over the third layer and thereafter curing the fourth layer.

It is preferable to produce tamperproof devices containing all four layers wherein the first layer is produced from a hydrogen silsesquioxane resin and filler mixture comprised of tungsten carbide (WC), tungsten metal (W), diamond dust and phosphorous pentoxide ($P_2O_5$); the second layer is produced from a colloidal inorganic-based siloxane resin; the third layer is produced from PECVD of amorphous SiC:H, diamond or silicon nitride; and the fourth layer is produced from a colloidal inorganic-based siloxane resin.

So that those skilled in the art can understand and appreciate the invention taught herein, the following examples are presented, it being understood that these examples should not be used to limit the scope of this invention found in the claims.

What is claimed is:

1. An electronic device produced by a method comprising
   (A) forming a protection layer on an electronic device by applying on the electronic device a composition comprising a preceramic silicon-containing material and a filler to a surface of the electronic device and thereafter heating the composition to a temperature sufficient to convert the preceramic silicon-containing material into a silica-containing ceramic having filler dispersed therein; and
   (B) forming a resin sealer coat over the protection layer by applying a sealer resin selected from the group consisting of colloidal inorganic-based siloxane resins, benzocyclobutene based resins, a polyimide polymers, a siloxane polyimides and parylenes and thereafter curing the sealer resin to produce the resin sealer coat.

2. The electronic device as claimed in claim 1 wherein a cap coating layer is formed over the resin sealer coat by depositing onto the resin sealer coat a material selected from the group consisting of an amorphous SiC:H, diamond, silicon nitride and parylene.

3. The electronic device as claimed in claim 2 wherein a resin overcoat layer is formed over the cap coating layer by applying an overcoat resin selected from the group consisting of colloidal inorganic-based siloxane resins, benzocyclobutene based resins, polyimide polymers, siloxane polyimides, parylenes, photoresist polymers, siloxane room temperature vulcanizable compositions, and organic polymers and thereafter curing the overcoat resin to produce the resin overcoat layer.

4. The electronic device as claimed in 1 wherein the preceramic silicon-containing material is selected from the group consisting of hydrogen silsesquioxane resin, hydrolyzed or partially hydrolyzed compounds or mixtures of compounds having the formula $R^1_n Si(OR^1)_{4-n}$ wherein each $R^1$ is independently selected from the group consisting of aliphatic, alicyclic and aromatic substituents having from 1 to 20 carbon atoms and n has a value of 0, 1, 2 or 3.

5. The electronic device as claimed in claim 4 wherein the silicon oxide precursor is a hydrogen silsesquioxane resin.

6. The electronic device as claimed in claim 1 wherein the filler is selected from the group consisting of optically opaque fillers, radiopaque fillers, luminescent fillers, oxidation resistant filler, abrasion resistant fillers, magnetic fillers, conductive fillers, flux materials and mixtures thereof.

7. The electronic device as claimed in claim 1 wherein the composition comprising the preceramic silicon-containing material and filler is heated to a temperature of 50° C. to 450° C.

8. The electronic device as claimed in claim 1 wherein the protection layer has a thickness of 0.5 to 500 micrometers.

9. The electronic device as claimed in claim 1 wherein the sealer resin of (B) is a colloidal inorganic-based siloxane resin.

10. The electronic device as claimed in claim 9 wherein the sealer resin is cured by heating the resin at a temperature 60° C. to 400° C.

11. The electronic device as claimed in claim 1 wherein the resin sealer coat has a thickness of 0.1 to 8 micrometers.

12. The electronic device as claimed in claim 2 wherein the cap coating layer is formed by the plasma enhanced chemical vapor deposition of amorphous SiC:H.

13. The electronic device as claimed in claim 2 wherein the cap coating layer is formed by the plasma enhanced chemical vapor deposition of silicon nitride.

14. The electronic device as claimed in claim 2 wherein the cap coating layer has a thickness of from 0.1 to 100 micrometers.

15. The electronic device as claimed in claim 3 wherein the overcoat resin is a colloidal inorganic-based siloxane resin.

16. The electronic device as claimed in claim 15 wherein the overcoat resin is cured by heating the resin at a temperature 60° C. to 400° C.

17. The method as claimed in claim 3 wherein the resin overcoat layer has a thickness of 0.1 to 8 micrometers.

* * * * *